(12) United States Patent
Chang et al.

(10) Patent No.: US 9,679,961 B2
(45) Date of Patent: Jun. 13, 2017

(54) TRANSISTOR WITH WURTZITE CHANNEL

(71) Applicants: Taiwan Semiconductor Manufacturing Company, Ltd., Hsin-Chu (TW); National Taiwan University, Taipei (TW)

(72) Inventors: Hung-Chih Chang, Taichung (TW); Pin-Shiang Chen, Taipei (TW); Chee-Wee Liu, Taipei (TW); Samuel C. Pan, Hsin-Chu (TW)

(73) Assignees: Taiwan Semiconductor Manufacturing Company, Ltd., Hsin-Chu (TW); National Taiwan University, Taipei (TW)

( * ) Notice: Subject to any disclaimer, the term of this patent is extended or adjusted under 35 U.S.C. 154(b) by 0 days.

(21) Appl. No.: 15/221,067

(22) Filed: Jul. 27, 2016

(65) Prior Publication Data
US 2016/0336389 A1 Nov. 17, 2016

Related U.S. Application Data

(63) Continuation of application No. 14/586,472, filed on Dec. 30, 2014, now Pat. No. 9,425,250.

(51) Int. Cl.
| | | |
|---|---|---|
| *H01L 21/00* | (2006.01) | |
| *H01L 29/04* | (2006.01) | |
| *H01L 29/16* | (2006.01) | |
| *H01L 29/78* | (2006.01) | |
| *H01L 29/423* | (2006.01) | |
| *H01L 29/786* | (2006.01) | |
| *H01L 21/02* | (2006.01) | |
| *H01L 21/306* | (2006.01) | |
| *H01L 21/3105* | (2006.01) | |
| *H01L 21/762* | (2006.01) | |
| *H01L 29/06* | (2006.01) | |

(Continued)

(52) U.S. Cl.
CPC ........ *H01L 29/045* (2013.01); *H01L 21/0243* (2013.01); *H01L 21/02389* (2013.01); *H01L 21/02392* (2013.01); *H01L 21/02422* (2013.01); *H01L 21/02532* (2013.01); *H01L 21/30604* (2013.01); *H01L 21/30612* (2013.01); *H01L 21/31051* (2013.01); *H01L 21/76224* (2013.01); *H01L 29/0649* (2013.01); *H01L 29/16* (2013.01); *H01L 29/20* (2013.01); *H01L 29/42392* (2013.01); *H01L 29/66484* (2013.01); *H01L 29/66522* (2013.01); *H01L 29/66666* (2013.01); *H01L 29/66795* (2013.01); *H01L 29/785* (2013.01); *H01L 29/7831* (2013.01); *H01L 29/78642* (2013.01); *H01L 29/78654* (2013.01); *H01L 29/78684* (2013.01)

(58) Field of Classification Search
CPC ............. H01L 29/045; H01L 29/78684; H01L 29/78654; H01L 29/78642
USPC ....................................................... 438/157
See application file for complete search history.

(56) References Cited

U.S. PATENT DOCUMENTS 7,425,740 B2 9/2008 Liu et al.
8,048,723 B2 11/2011 Chang et al.
(Continued)

*Primary Examiner* — Anthony Ho
(74) *Attorney, Agent, or Firm* — Slater Matsil, LLP

(57) ABSTRACT

A device includes a source region, a drain region, and a wurtzite semiconductor between the source region and the drain region. A source-drain direction is parallel to a [01-10] direction or a [−2110] direction of the wurtzite semiconductor. The device further includes a gate dielectric over the wurtzite semiconductor, and a gate electrode over the gate dielectric.

20 Claims, 13 Drawing Sheets

(51) Int. Cl.
   *H01L 29/20*    (2006.01)
   *H01L 29/66*    (2006.01)

(56) References Cited

U.S. PATENT DOCUMENTS

| | | |
|---|---|---|
| 8,053,299 B2 | 11/2011 | Xu |
| 8,183,627 B2 | 5/2012 | Currie |
| 8,415,718 B2 | 4/2013 | Xu |
| 8,497,177 B1 | 7/2013 | Chang et al. |
| 8,609,518 B2 | 12/2013 | Wann et al. |
| 8,618,556 B2 | 12/2013 | Wu et al. |
| 8,633,516 B1 | 1/2014 | Wu et al. |
| 8,703,565 B2 | 4/2014 | Chang et al. |
| 8,742,509 B2 | 6/2014 | Lee et al. |
| 8,776,734 B1 | 7/2014 | Roy et al. |
| 8,785,285 B2 | 7/2014 | Tsai et al. |
| 8,796,666 B1 | 8/2014 | Huang et al. |
| 8,816,444 B2 | 8/2014 | Wann et al. |
| 2013/0285153 A1 | 10/2013 | Lee et al. |
| 2014/0183600 A1 | 7/2014 | Huang et al. |
| 2014/0264590 A1 | 9/2014 | Yu et al. |
| 2014/0264592 A1 | 9/2014 | Oxland et al. |

TRANSISTOR WITH WURTZITE CHANNEL

PRIORITY CLAIM AND CROSS-REFERENCE

This application is a continuation of U.S. patent application Ser. No. 14/586,472, entitled "Transistor with Wurtzite Channel," filed on Dec. 30, 2014, which application is incorporated herein by reference.

BACKGROUND

With the increasing down-scaling of integrated circuits and increasingly demanding requirement to the speed of integrated circuits, transistors need to have higher drive currents with smaller dimensions. Various methods have been developed to increase the drive currents of transistors. For example, Fin Field-Effect Transistors (FinFETs) and Gate All-Around (GAA) transistors were developed. FinFETs and GAA transistors have increased channel widths. For a FinFET, the increase in the channel widths is achieved by forming channels that include portions on the sidewalls of a semiconductor fin and a portion on the top surface of the semiconductor fin. For a GAA transistor, the channel is formed around a semiconductor region. Since the drive currents of transistors are proportional to the channel widths, the drive currents of the FinFETs and GAA transistors are increased over that of conventional planar transistors.

Another widely used method for increasing the drive currents includes applying stresses to the channel regions of transistors. For example, stresses may be applied by forming source/drain stressors in the source/drain regions of the transistors. Other available methods include forming a strained layer, such as a strained contact etch stop layer to cover the transistor. Additional methods are also explored.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3 through 9A and FIG. 9B illustrate the cross-sectional views of intermediate stages in the formation of a Fin Field-Effect Transistor (FinFET) including a wurtzite semiconductor material in accordance with some embodiments;

DETAILED DESCRIPTION

Figure 1:
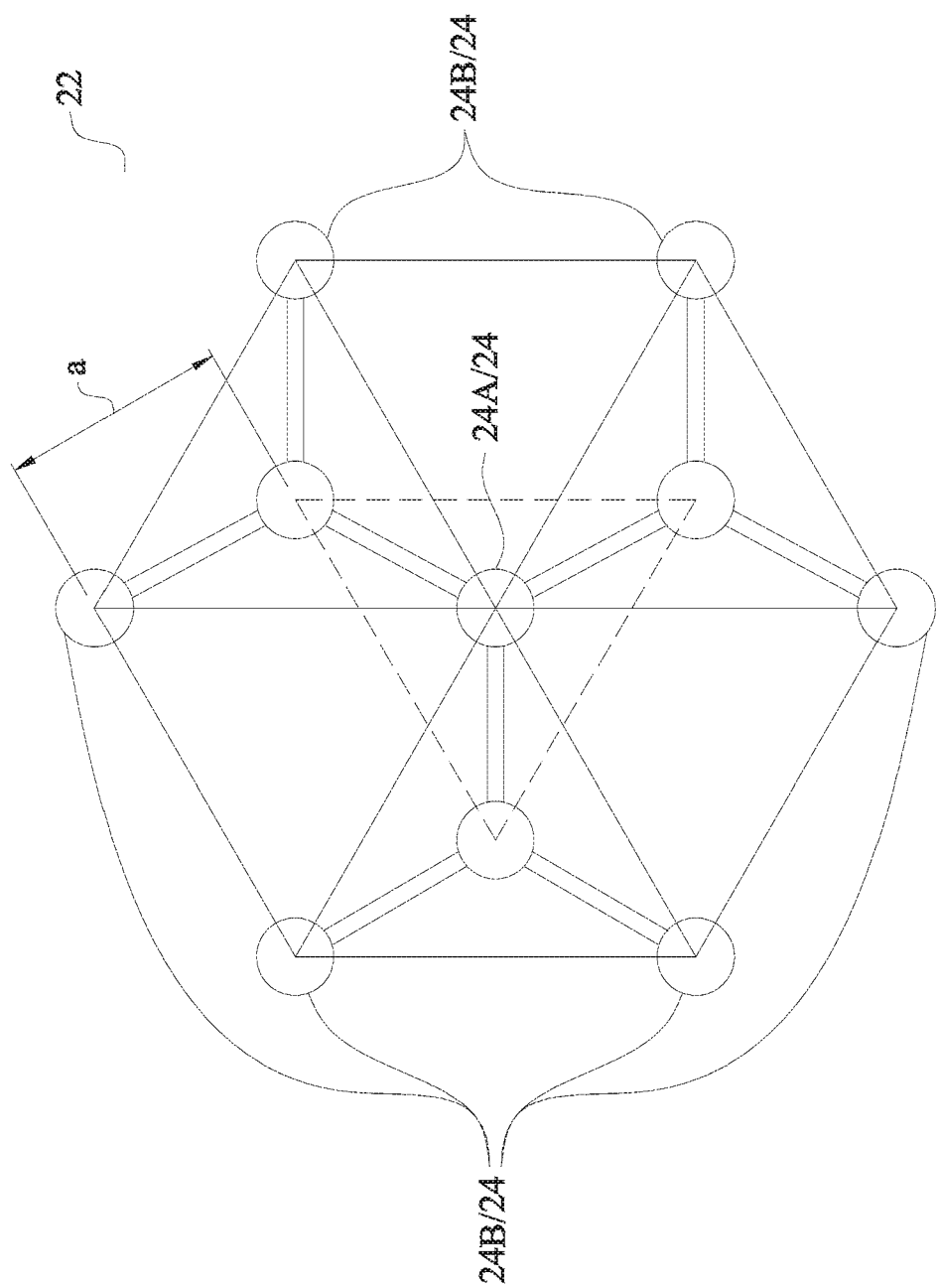
FIGS. 1 and 2 illustrate a top view and a side view, respectively, of a portion of a wurtzite semiconductor material in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors with wurtzite channels and the methods of forming the same are provided in accordance with various exemplary embodiments. The intermediate stages of forming the transistors in accordance with exemplary embodiments are illustrated. The variations of the embodiments are discussed. Throughout the various views and illustrative embodiments, like reference numbers are used to designate like elements.

Figure 2:
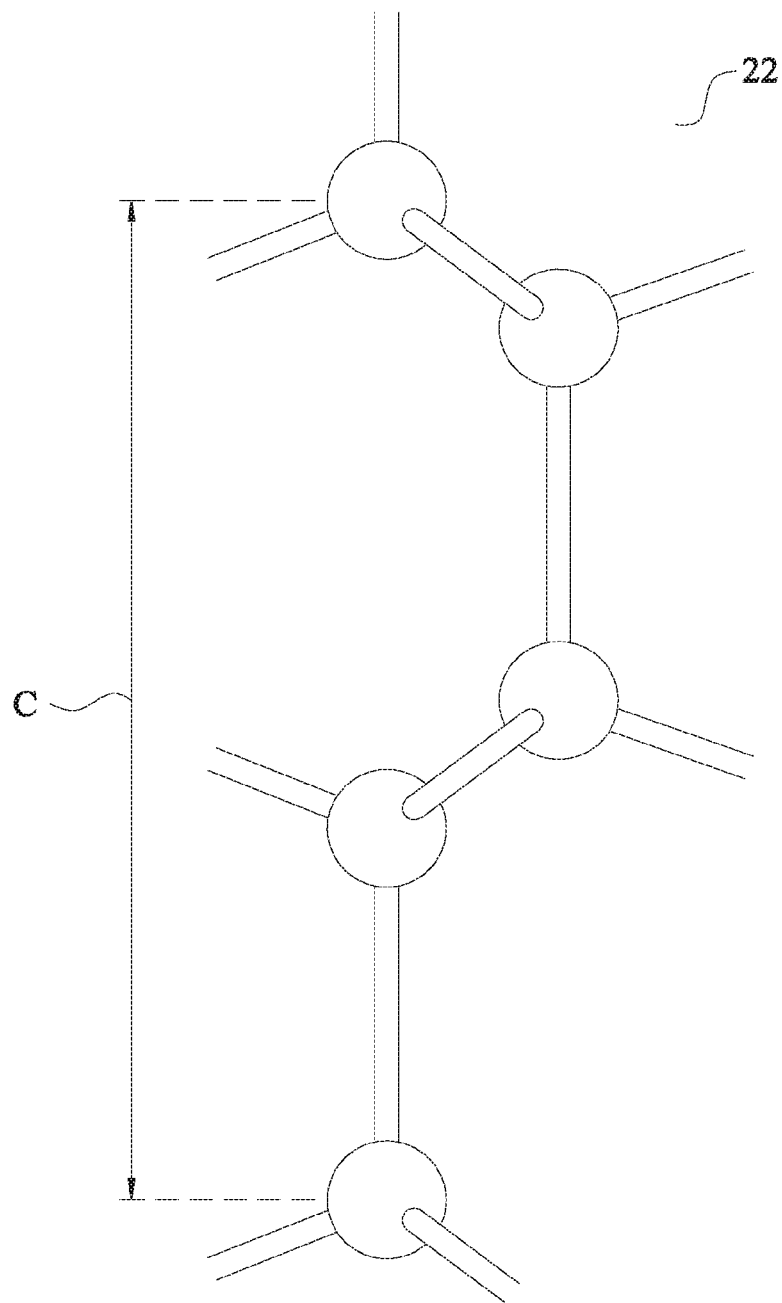

FIGS. 1 and 2 illustrate a top view and a side view, respectively, of a semiconductor material in accordance with some embodiments. The structure illustrated in FIGS. 1 and 2 have a hexagonal structure, which is also known as wurtzite structure. The respective semiconductor material is referred to as a wurtzite semiconductor material. As shown in FIG. 1, in the top view, semiconductor material 22 includes atoms 24, which include atoms 24A and 24B. In accordance with some embodiments of the present disclosure, semiconductor material 22 is wurtzite silicon, and atoms 24 are silicon atoms. In accordance with alternative embodiments of the present disclosure, semiconductor material 22 is a wurtzite germanium, and atoms 24 are germanium atoms.

In the top view as shown in FIG. 1, atom 24A is at the center of the illustrated portion of dielectric material 22, and six atoms 24B form a hexagonal structure surrounding atom 24A. It is appreciated that atoms 24A and 24B are actually the same as each other, and if other portions of semiconductor material 22 are illustrated, each of atoms 24B may be at the center of six other atoms that form a hexagonal structure.

Wurtzite silicon has two forms. The first form is referred to as direct-band wurtzite silicon, and the second form is referred to as indirect-band wurtzite silicon. The direct-band wurtzite silicon and the indirect-band wurtzite silicon have similar structures as shown in FIGS. 1 and 2, except their lattice constants are different from each other. For example, in the direct-band wurtzite silicon, the lattice constant "a" (in-plane lattice constant) as shown in FIG. 1 is equal to 4.04 Å, and the lattice constant "c" as shown in FIG. 2 is equal to 6.6 Å. In the indirect-band wurtzite silicon, the lattice constant "a" as shown in FIG. 1 is equal to 3.8 Å, and the lattice constant "c" as shown in FIG. 2 is equal to 6.27 Å.

Wurtzite germanium has the direct-band structure and does not have the in-direct-band structure. In the respective direct-band wurtzite germanium, the lattice constant "a" as shown in FIG. 1 is equal to 3.96 Å, and the lattice constant "c" as shown in FIG. 2 is equal to 6.5 Å.

Figure 17:
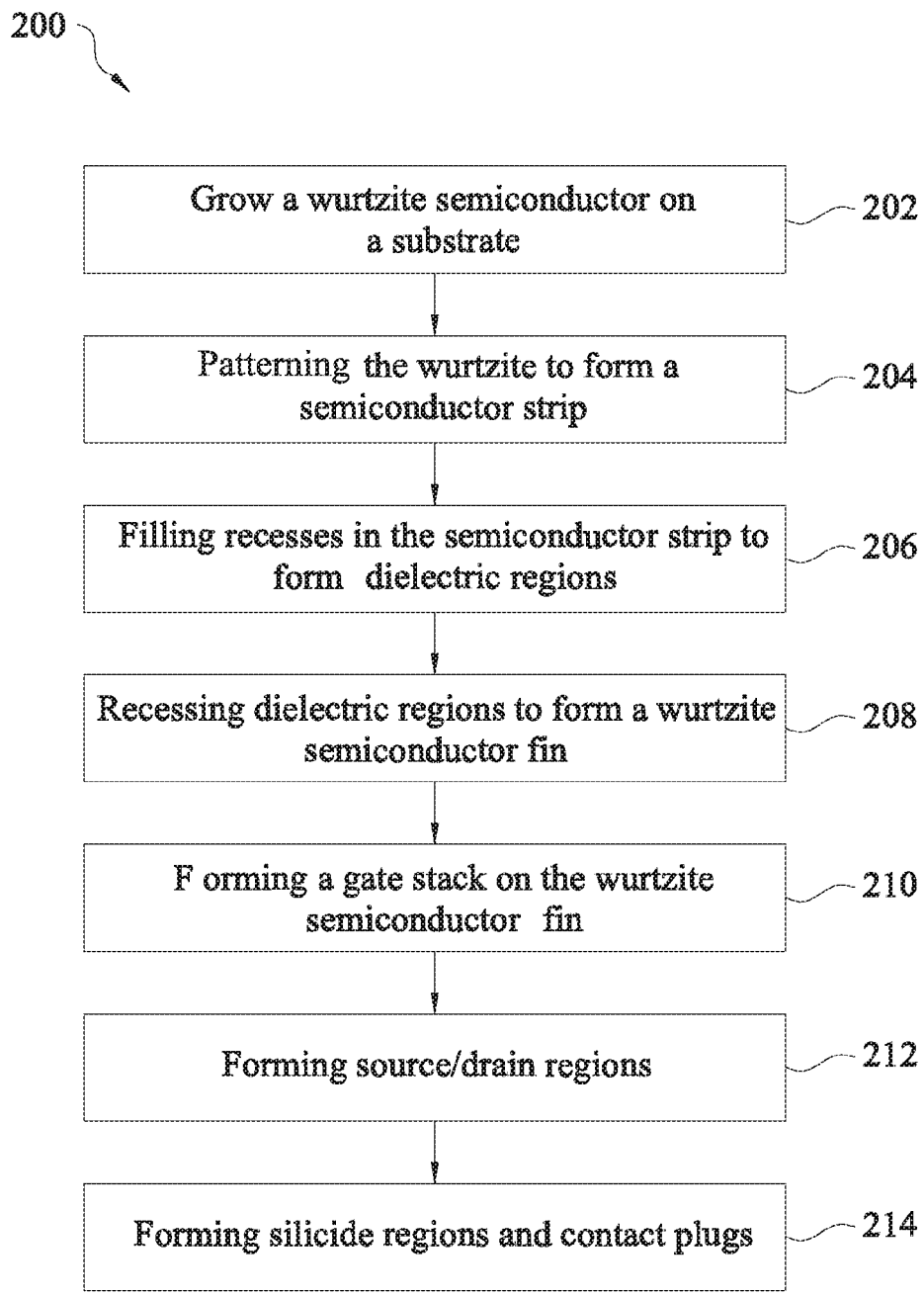
FIG. 17 illustrates a process flow for forming a FinFET including a wurtzite semiconductor material in accordance with some embodiments.

FIGS. 3 through 9A and FIG. 9B illustrate the cross-sectional views of intermediate stages in the formation of a transistor having a wurtzite structure in accordance with some embodiments of the present disclosure. The steps shown in FIG. 3 through 9A are also illustrated schematically in the process flow 200 as shown in FIG. 17. In the subsequent discussion, the process steps shown in FIGS. 3 through 9A are discussed referring to the process steps in FIG. 17.

Figure 3:
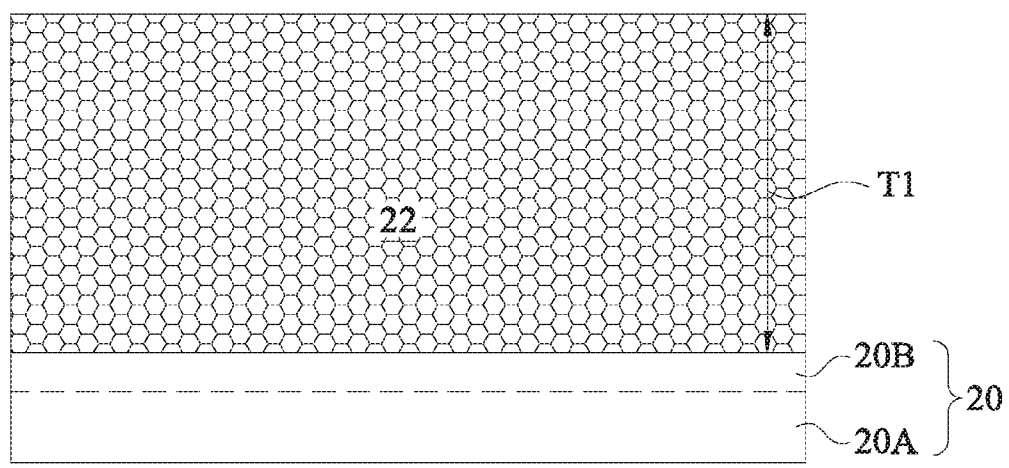

Referring to FIG. 3, substrate 20 is provided. In accordance with some embodiments of the present disclosure, substrate 20 is formed of a material in which the atoms have a hexagonal structure. Exemplary materials of substrate 20 include silicon oxide, gallium nitride (GaN), gallium phosphide (GaP), or the like. In some embodiments, substrate 20 is formed of a homogenous material, wherein an entirety of substrate 20 is formed of the same material (such as silicon oxide, GaN, or GaP) having the same structure. In alternative embodiments of the present disclosure, substrate 20 has a multi-layer structure, which includes, and is not limited to, a Semiconductor-On-Insulator (SOI) structure, an insulator-on-semiconductor structure, or the like. For example, substrate 20 may include silicon oxide layer 20B on silicon layer 20A. Alternatively, substrate 20 may further include a hexagonal semiconductor (not shown) such as GaN or GaP located over insulator 20B (such as silicon oxide), which is further over silicon layer 20A. In alternative embodiments, substrate 20 comprises diamond cubic silicon with a cubic structure.

As also shown in FIG. 3, semiconductor layer 22 is grown over substrate 20. The respective step is shown as step 202 in the process flow shown in FIG. 17. Semiconductor layer 22 has a wurtzite structure, and may comprise direct-band wurtzite silicon, indirect-band wurtzite silicon, or direct-band wurtzite germanium in accordance with various embodiments. Accordingly, semiconductor layer 22 is referred to as wurtzite semiconductor layer 22 throughout the description. Wurtzite semiconductor layer 22 is in contact with the top layer of substrate 20, wherein the top layer may have a hexagonal structure, and may comprise silicon oxide, GaN, GaP, or the like. Thickness T1 of wurtzite semiconductor layer 22 may be in the range between about 1 µm and about 50 µm, and greater or smaller thicknesses may be adopted. It is appreciated that the values recited throughout the description are examples, and may be changed to different values.

In accordance with some embodiments of the present disclosure, wurtzite semiconductor layer 22 is formed through epitaxy in a deposition step, wherein Physical Vapor Deposition (such as pulsed laser ablation), Chemical Vapor Deposition (CVD), or the like, may be used. In the embodiments in which pulsed laser ablation is used, a target formed of silicon or germanium is vaporized by laser pulses, and silicon or germanium is deposited on substrate 20. During the deposition, substrate 20 may be at room temperature or an elevated temperature, for example, in the range between about 20° C. and about 700° C. In some exemplary embodiments, the temperature of substrate 20 is in the range between about 20° C. and about 30° C.

Figure 14:
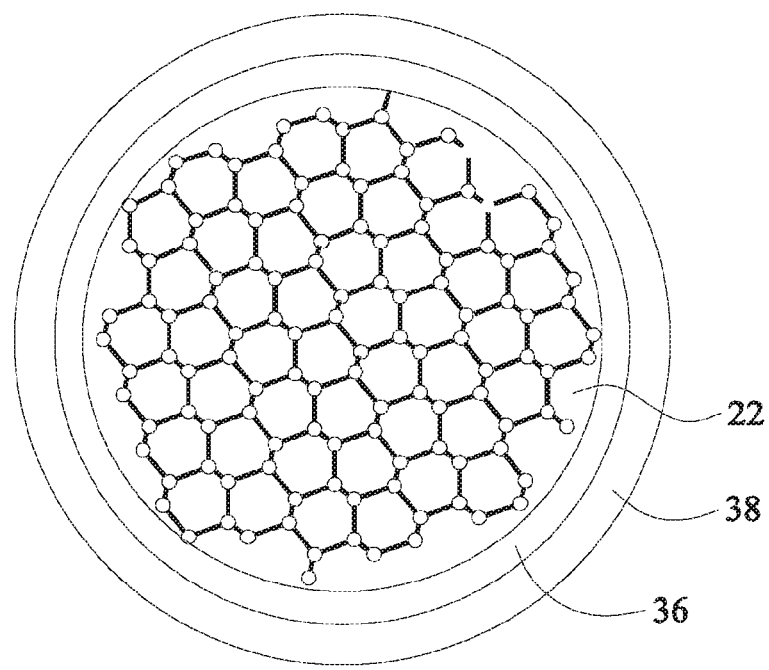
FIG. 14 illustrates a top view (or a bottom view) of a wurtzite semiconductor nanowire used as a channel of a VGAA transistor in accordance with some embodiments.

In the alternative embodiments in which CVD is used to form wurtzite silicon, silane and hydrogen ($H_2$) may be used as process gases. Silane may have a volume percentage between about 1 percent and about 10 percent in accordance with some embodiments of the present disclosure. The pressure of the chamber in which the CVD is performed may be in the range between about $1 \times 10^{-6}$ mbar and about $1 \times 10^{-5}$ mbar in accordance with some embodiments. The temperature of substrate 20 during the CVD may be in the range between about 450° C. and about 700° C. in some embodiments. These exemplary process conditions may also be used when the wurtzite semiconductor 22 is formed as a nanowire, for example, as shown in FIG. 14.

Figure 15:
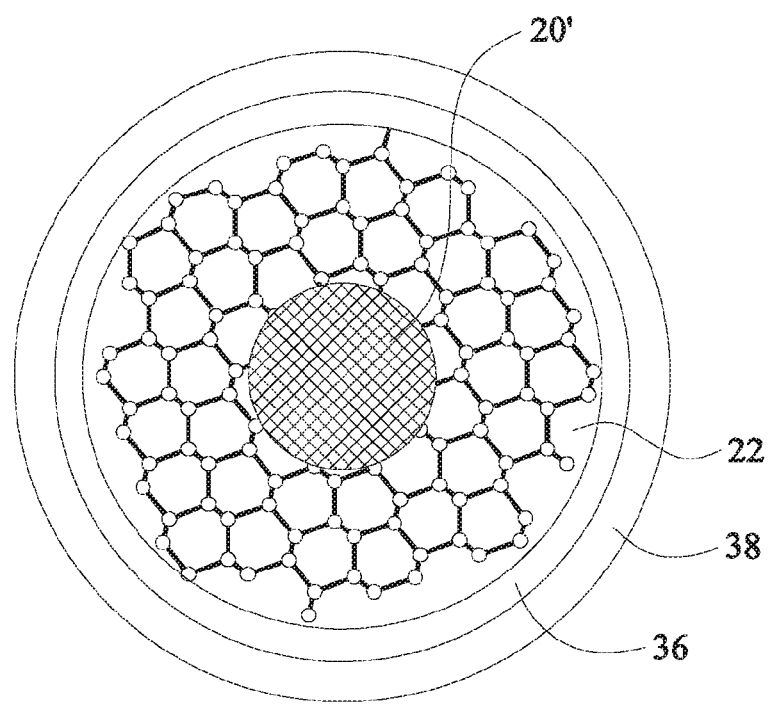
FIG. 15 illustrates a top view (or a bottom view) of a wurtzite semiconductor nano-tube used as a channel of a VGAA transistor in accordance with some embodiments.

In yet alternative embodiments in which CVD is used to form wurtzite silicon, disilane (without hydrogen ($H_2$)) may be used as the process gas. The pressure of the chamber in which the CVD is performed may be in the range between about $2 \times 10^{-3}$ mbar and about $1 \times 10^{-2}$ mbar in accordance with some exemplary embodiments. The temperature of substrate 20 during the CVD may be in the range between about 400° C. and about 700° C. in some embodiments. These embodiments may also be used when the wurtzite semiconductor 22 is formed as a nano-tube around a nanowire, for example, as shown in FIG. 15.

In yet alternative embodiments in which pulsed laser ablation is used to form wurtzite germanium, a germanium target is used, from which germanium vapor is generated, and germanium is deposited on substrate 20. The temperature of substrate 20 during the pulsed laser ablation may be at a room temperature or an elevated temperature, for example, in the range between about 20° C. and about 700° C. In some exemplary embodiments, the temperature of substrate 20 is in the range between about 20° C. and about 30° C. The thickness T1 of wurtzite germanium layer 22 may also be in the range between about 1 µm and about 20 µm.

Figure 4A:
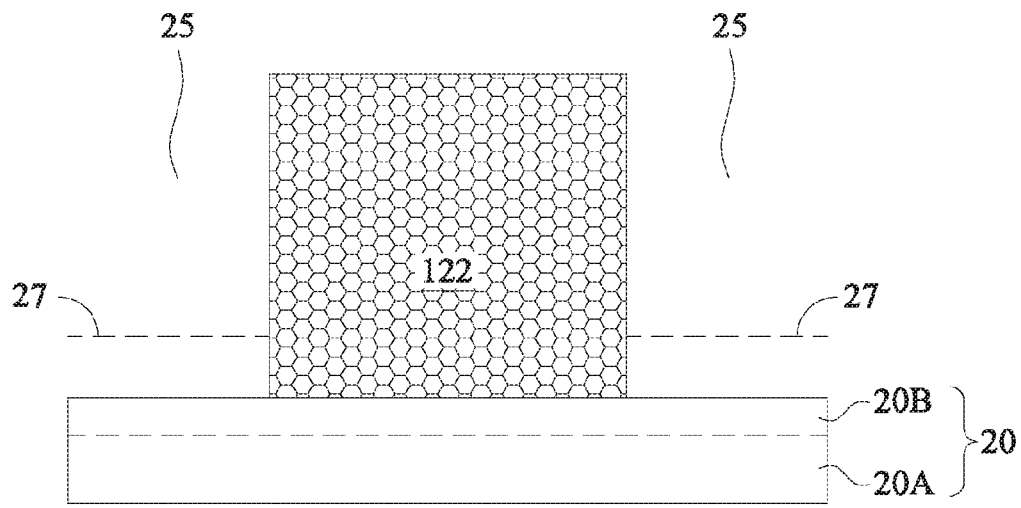
Figure 4B:
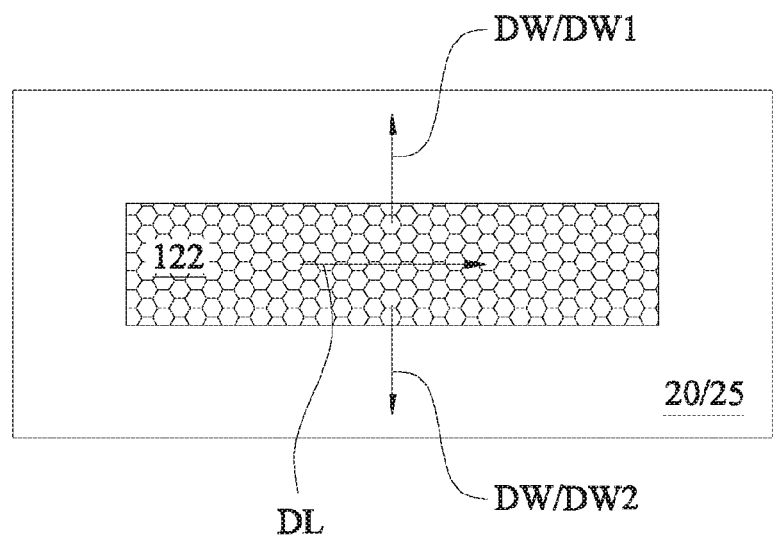

Referring to FIGS. 4A and 4B, wurtzite semiconductor layer 22 is patterned, for example, in a photo lithography step. The respective step is shown as step 204 in the process flow shown in FIG. 17. FIGS. 4A and 4B illustrate a cross-sectional view and a top view, respectively. As shown in FIG. 4A, recesses 25 are formed to extend into wurtzite semiconductor layer 22. The resulting remaining portion of wurtzite semiconductor layer 22 is referred to as wurtzite semiconductor strip 122 throughout the description. The patterning may include a dry etch step. In accordance with some embodiments of the present disclosure, the patterning is performed until substrate 20 is exposed. In accordance with alternative embodiments, the patterning is stopped when the resulting recesses 25 extend to an intermediate level between the top surface and the bottom surface of wurtzite semiconductor layer 22 (FIG. 3). For example, line 27 schematically represents the positions of the bottoms of recesses 25 in accordance with these embodiments.

Figure 9A:
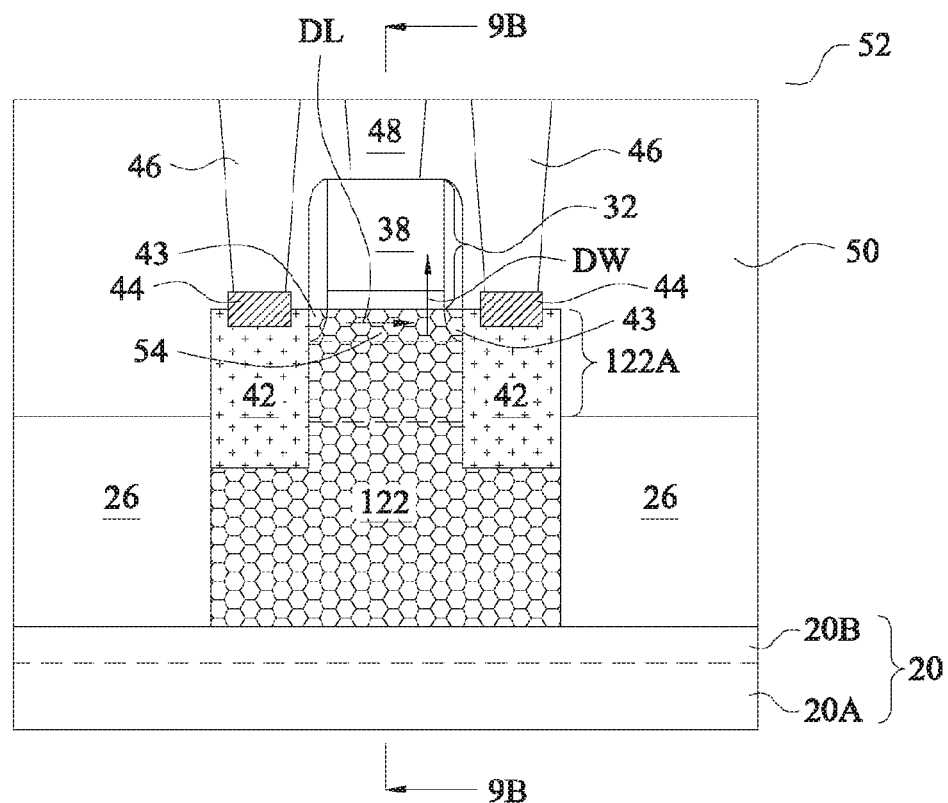

FIG. 4B illustrates a top view of the structure in FIG. 4A in accordance with some embodiments. As shown in FIG. 4B, the lengthwise direction DL and widthwise direction DW of wurtzite semiconductor strip 122 are illustrated. In accordance with some embodiments, wurtzite semiconductor strip 122 comprises a direct-band wurtzite material such as direct-band wurtzite silicon or direct-band wurtzite germanium. The lengthwise direction DL is in (parallel to) the [01-10] direction of wurtzite semiconductor layer 22, wherein the symbol "−" in the expression "−1" means a negative direction, and may be expressed alternatively as having a negative sign above the symbol "1." Lengthwise direction DL is also the direction connecting source and drain regions 42 of the resulting FinFET 52, as shown in FIG. 9A. The widthwise directions DW1 or DW2 may be in (parallel to) the [0001] direction of wurtzite semiconductor layer 22. In other embodiments, widthwise directions DW1 or DW2 are in directions other than the [0001] direction.

In accordance with some embodiments, wurtzite semiconductor strip 122 comprises an indirect-band wurtzite material such as indirect-band wurtzite silicon. The lengthwise direction DL is in (parallel to) the [−2110] direction of wurtzite semiconductor layer 22, wherein the symbol "−" in the expression "−2" means a negative direction, and may be expressed alternatively as having a negative sign above the symbol "2." Widthwise direction DW1 or DW2 in these embodiments may be in (parallel to) the [01-10] direction of wurtzite semiconductor layer 22.

Figure 5:
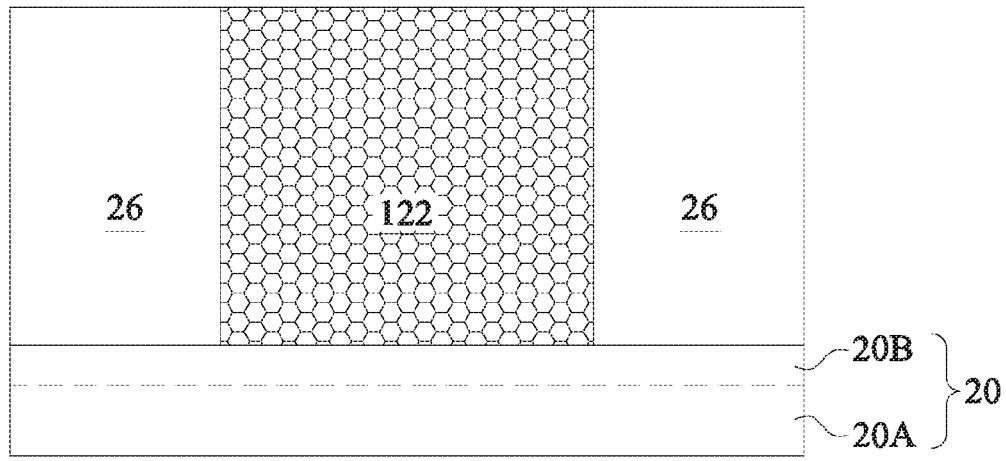

Recesses 25 as shown in FIGS. 4A and 4B are then filled with a dielectric material, forming dielectric regions 26 as shown in FIG. 5. The respective step is shown as step 206 in the process flow shown in FIG. 17. Although FIG. 5 illustrates dielectric regions 26 as separate regions, the illustrated dielectric regions 26 may be portions of a continuous dielectric region that fully encircles wurtzite semiconductor strip 122. In accordance with some exemplary embodiments, the filling of dielectric regions 26 is performed using spin-on coating, Flowable Chemical Vapor Deposition (FCVD), or the like. In alternative embodiments, dielectric regions 26 are formed using a deposition method such as High Aspect Ratio Deposition (HARP), High-Density Plasma (HDP) deposition, or the like. After the deposition, a planarization such as a Chemical Mechanical Polish (CMP) may be performed to level the top surface of wurtzite semiconductor strip 122 with the top surface of dielectric regions 26.

Dielectric regions 26 may comprise a material the same as or different from the material of the underlying substrate 20. In accordance with some embodiments of the present disclosure, dielectric regions 26 are formed of silicon oxide, silicon nitride, silicon carbide, silicon oxynitride, or the like.

Figure 6:
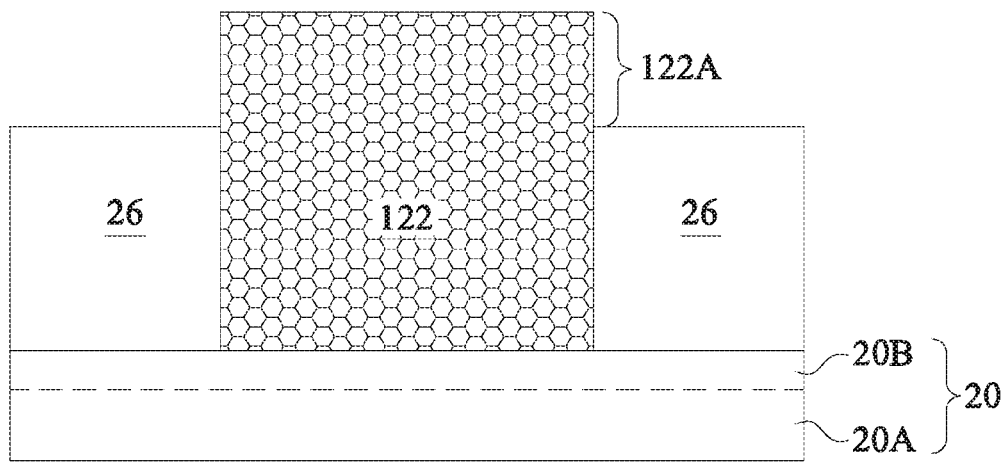

Referring to FIG. 6, dielectric regions 26 are recessed, so that a top portion of wurtzite semiconductor strip 122 protrudes over the top surfaces of the remaining dielectric regions 26, and hence wurtzite semiconductor fin 122A is formed. The respective step is shown as step 208 in the process flow shown in FIG. 17. In some exemplary embodiments, the recessing is performed in a dry etching process, wherein HF and $NH_3$ are used as the etching gases. In alternative embodiments, the etching gases include $NF_3$ and $NH_3$. During the etching process, plasma may be generated. Alternatively, in the etching process, plasma is not generated. In an exemplary etching process, the etching gases have a pressure in the range between about 100 mtorr and about 200 mtorr. For example, the flow rate of HF may be in the range between about 50 sccm and about 150 sccm. The flow rate of $NH_3$ may be in the range between about 50 sccm and about 150 sccm. In alternative embodiments, the recessing of dielectric regions 26 is performed using wet etching. The etchant may include diluted HF, for example.

Figure 7:
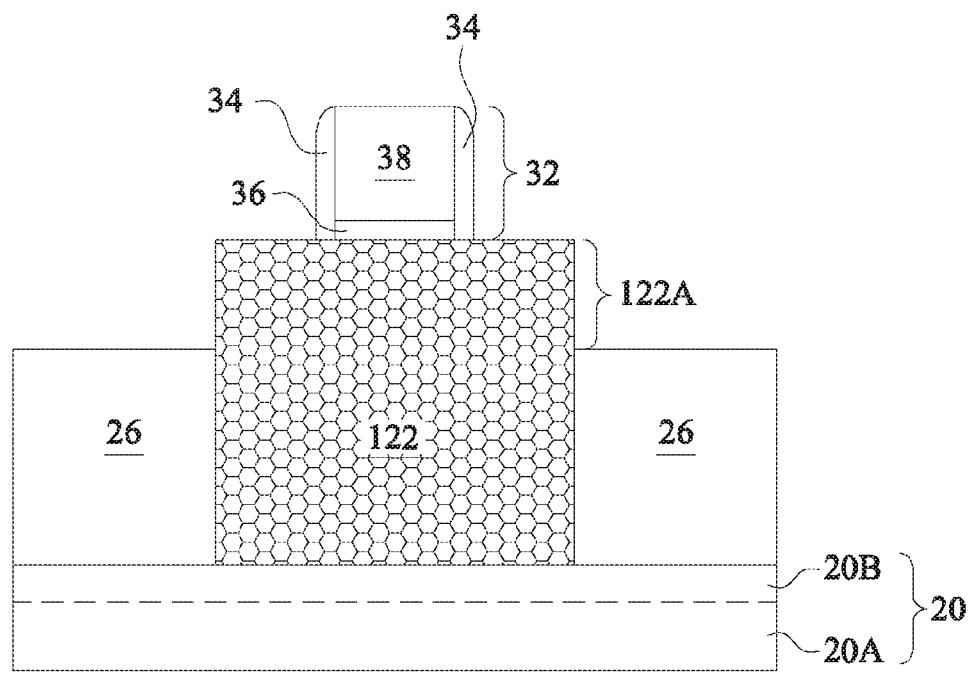

FIG. 7 illustrates the formation of gate stack 32 and gate spacers 34. The respective step is shown as step 210 in the process flow shown in FIG. 17. Referring to FIG. 7, gate stack 32 includes gate dielectric 36 and gate electrode 38 over gate dielectric 36, with gate spacers 34 on the sidewalls of gate stack 32. In some embodiments, gate dielectric 36 includes a high-k dielectric material comprising a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0, and sometimes as high as 21.0 or higher. In alternative embodiments, silicon oxide, silicon nitride, or the like, may be used to form gate dielectric 36.

Gate electrode 38 may include TiN, TaN, TaC, TiAl, Ti, TiAlN, TaSiN, TaCN, combinations thereof, or multilayers thereof. Gate spacers 34 may include silicon oxide, silicon nitride, or multi-layers thereof. The formation of layers/regions 34, 36, and 38 may include Physical Vapor Deposition (PVD), Metal-Organic Chemical Vapor Deposition (MOCVD), and/or other applicable methods, depending on the materials of layers/regions 34, 36, and 38. Gate stack 32 comprises a top portion over the top surface of wurtzite semiconductor fin 122A, and sidewall portions on the sidewalls of wurtzite semiconductor fin 122A.

Figure 8:
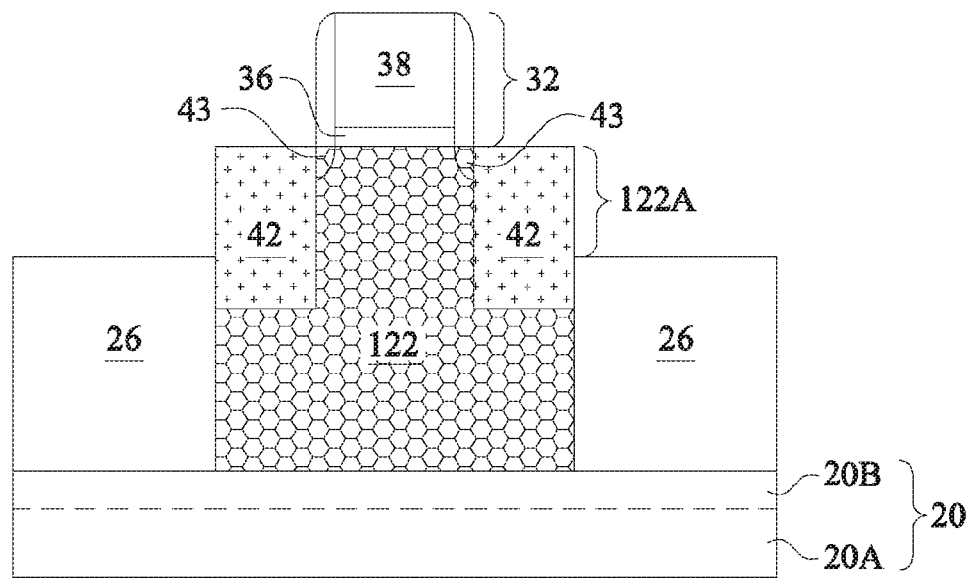

FIG. 8 illustrates the formation of source and drain regions (referred to as source/drain regions hereinafter) 40. The respective step is shown as step 212 in the process flow shown in FIG. 17. In addition, source/drain extension regions 43 may also be formed. In accordance with some exemplary embodiments, source/drain regions 42 and source/drain extension regions 43 are formed by implanting wurtzite semiconductor fin 122A with a p-type or an n-type impurity, depending on whether the resulting FinFET 52 (FIG. 9A) is a p-type FinFET or an n-type FinFET. For example, when FinFET 52 is a p-type FinFET, a p-type impurity such as boron or indium is implanted, and when FinFET 52 is an n-type FinFET, an n-type impurity such as phosphorus, arsenic, or antimony is implanted.

In accordance with alternative embodiments, in the formation of the source/drain regions 42, an etching step (referred to as source/drain recessing hereinafter) is performed to etch the portions of wurtzite semiconductor strip 122 that are not covered by gate stack 32 and gate spacers 34. The recessing may be anisotropic, and hence the portions of wurtzite semiconductor fin 122A directly underlying gate stack 32 and gate spacers 34 are protected, and are not etched substantially. Next, source/drain regions 42 are epitaxially grown from the recesses. In some exemplary embodiments, source/drain regions 42 comprise silicon germanium or silicon. Depending on whether the resulting FinFET is a p-type FinFET or an n-type FinFET, a p-type or an n-type impurity may be in-situ doped with the proceeding of the epitaxy. For example, when the resulting FinFET 52 is a p-type FinFET, SiGeB may be grown. Conversely, when the resulting FinFET 52 is an n-type FinFET, SiP may be grown. The re-grown source/drain regions 42 introduce desirable strain to the channel region of the resulting FinFET 52.

FIG. 9A illustrates the formation source/drain silicide regions 44, source/drain contact plugs 46, gate contact plug 48, and Inter-Layer Dielectric (ILD) 50. The respective step is shown as step 214 in the process flow shown in FIG. 17. The exemplary formation process may include forming ILD 50 first, forming contact openings in ILD 50 to expose source/drain regions 42, siliciding the exposed portions of source/drain regions 42 to form silicide regions 44, and forming contact plugs 46 and 48 to fill the remaining contact openings. ILD 50 may comprise Flowable oxide formed using, for example, Flowable Chemical Vapor Deposition (FCVD). ILD 50 may also be a spin-on glass formed using spin-on coating. For example, ILD 50 may comprise Phospho-Silicate Glass (PSG), Boro-Silicate Glass (BSG), Boron-Doped Phospho-Silicate Glass (BPSG), Tetraethyl Orthosilicate (TEOS) oxide, TiN, SiOC, or other low-k non-porous dielectric materials. Silicide regions 44 may be germanide when source/drain regions 42 are formed of germanium or germano-silicide when source/drain regions 42 are formed of silicon germanium.

FIG. 9A illustrates the source-drain direction DL, with channel region 54 between source/drain regions 42. Either of the left one and the right one of source/drain regions 42 may be the source region, and the other one may be the drain region. Throughout the description, the term "source-drain direction" refers to both the source-to-drain direction and the drain-to-source direction. Source-drain direction DL may be parallel to the [01-10] direction of wurtzite semiconductor strip 122 when channel region 54, which is a part of wurtzite semiconductor strip 122, is formed of direct-band wurtzite silicon or direct-band wurtzite germanium. Source-drain direction DL may also be parallel to the [−2110] direction of wurtzite semiconductor strip 122 (and channel 54) when channel region 54 is formed of indirect-band wurtzite silicon.

Figure 9B:
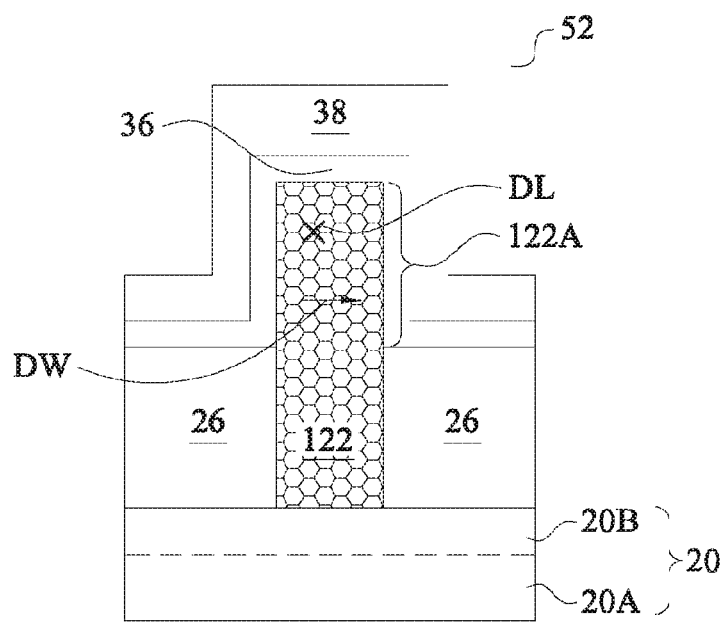

FIG. 9B illustrates the cross-sectional view of FinFET 52, wherein the cross-sectional view is obtained from the plane containing line 9B-9B in FIG. 9A. Directions DL and DW are illustrated in FIG. 9B.

Figure 10:
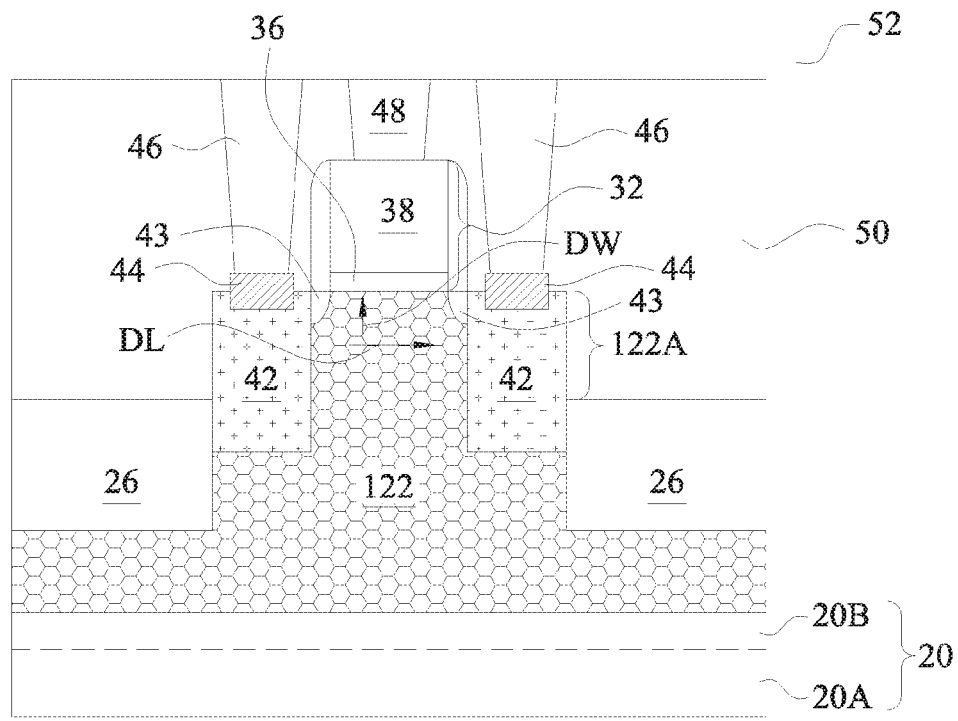
FIG. 10 illustrates a cross-sectional view of a FinFET including a wurtzite semiconductor material in accordance with alternative embodiments.

FIG. 10 illustrates the cross-sectional view of a FinFET in accordance with alternative embodiments. These embodiments are similar to the embodiments shown in FIG. 9A, except that in the patterning for forming wurtzite semiconductor strip 122 (shown in in FIG. 4A), the patterning stops when the bottom of the recesses 25 is at the position shown as line 27. As a result, in the resulting FinFET 52 as shown in FIG. 10, the wurtzite semiconductor material extends underlying dielectric regions 26.

FIGS. 11 through 15 illustrate transistors in accordance with alternative embodiments, wherein wurtzite semiconductors are used to form the channel regions of various types of transistors. When applicable, the materials and the formation methods of the components in these embodiments are similar to the like components, which are denoted by like reference numerals in the embodiments shown in FIGS. 1 through 9A. The details regarding the formation process and the materials of the components shown in FIGS. 11 through 15 may thus be found in the discussion of the embodiment shown in FIGS. 1 through 9A.

Figure 11:
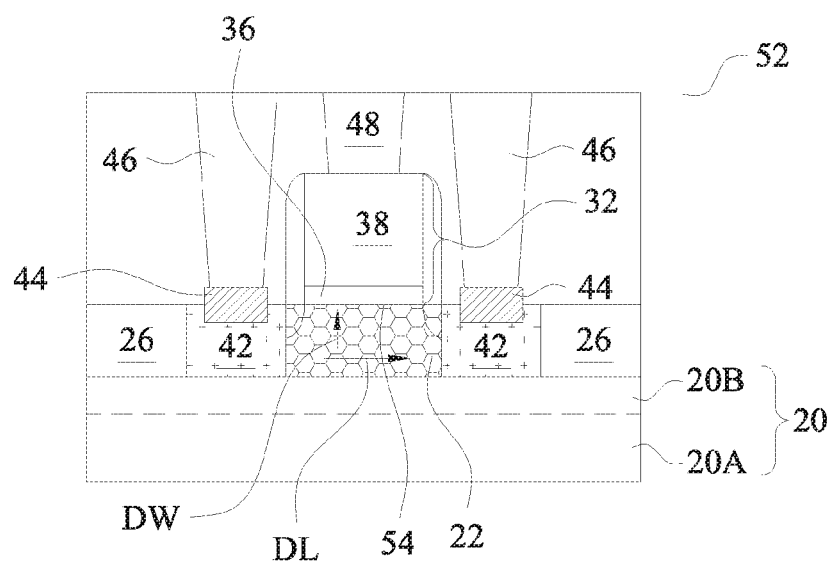
FIG. 11 illustrates a cross-sectional view of a planar single-gate transistor in accordance with some embodiments.

FIG. 11 illustrates single-gate planar transistor 52, which includes wurtzite semiconductor layer 22 to form the channel region of transistor 52. As shown in FIG. 11, lengthwise direction DL is in the source-drain direction. Direction DW may be perpendicular to the major top surface or bottom surface of substrate 20. In the embodiments wherein wurtzite semiconductor layer 22 (in which channel region 54 is located) is formed of direct-band wurtzite silicon or direct-band wurtzite germanium, source-drain direction DL may be parallel to the [01-10] direction of wurtzite semiconductor layer 22, and direction DW may be parallel to the [0001] direction of wurtzite semiconductor layer 22. In alternative embodiments in which wurtzite semiconductor layer 22 is formed of indirect-band wurtzite silicon, the respective source-drain direction DL is parallel to the [−2110] direction of wurtzite semiconductor layer 22, and the respective DW direction may be parallel to the [01-10] direction of wurtzite semiconductor layer 22.

Figure 12:
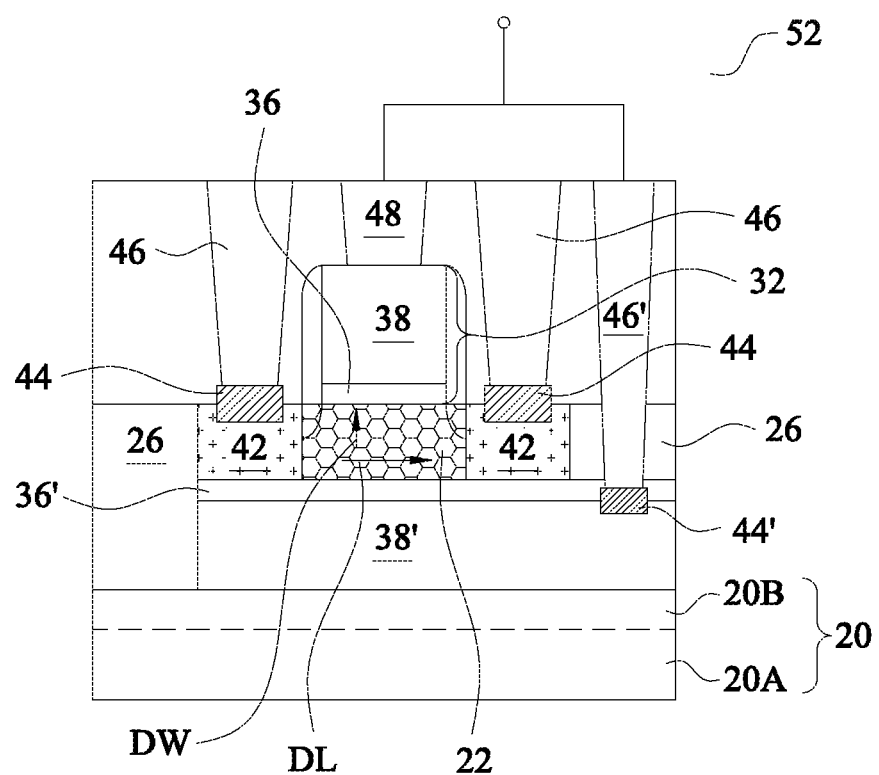
FIG. 12 illustrates a cross-sectional view of a planar double-gate transistor in accordance with some embodiments.

FIG. 12 illustrates double-gate planar transistor 52 in accordance with some embodiments. Double-gate planar transistor 52 is similar to single-gate planar transistor 52 as in FIG. 11, except that an additional gate dielectric 36' and additional gate electrode 38' is underlying wurtzite semiconductor layer 22. Hence, Double-gate planar transistor 52 includes top gate dielectric 36 and bottom gate dielectric 36', and top gate electrode 38 and bottom gate electrode 38'. Gate dielectric 36' may be formed of a material selected from the same group of candidate materials as gate dielectric 36, and gate electrode 38' may be formed of a material selected from the same group of candidate materials as gate electrode 38. Gate electrodes 38 and 38' are interconnected, so that a same gate voltage may be applied to gate electrodes 38 and 38' simultaneously. An additional source/drain contact plug 46' is used to connect to bottom gate electrode 38. The directions DL and DW are essentially the same as in FIG. 11, and hence are not repeated herein.

Figure 13:
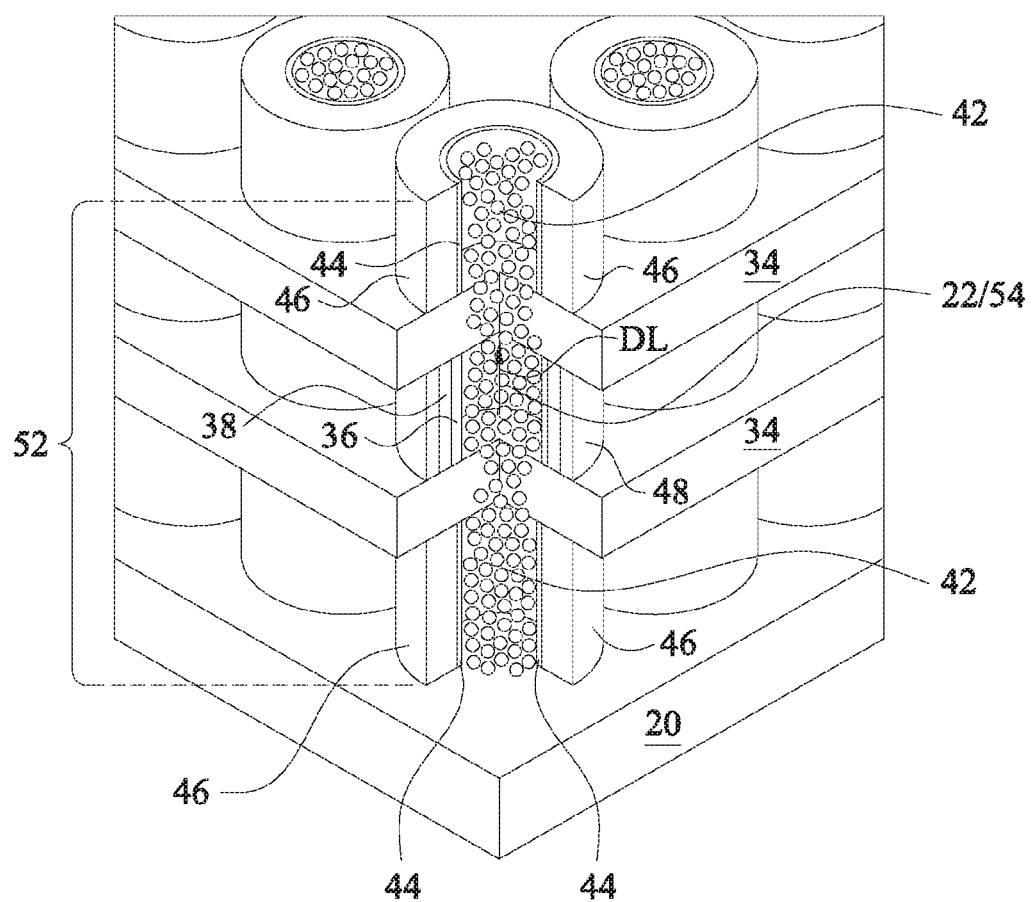
FIG. 13 illustrates a perspective view of a Vertical Gate-All-Around (VGAA) transistor in accordance with some embodiments.

FIG. 13 illustrates a Vertical Gate-All-Around (VGAA) transistor in accordance with some embodiments. In FIG. 13, portions of VGAA transistor 52 are not illustrated in order to show the internal structure of VGAA transistor 52. The un-illustrated portions, however, still exist. For example, the illustrated partial rings 44, 46, 48 etc. are portions of the respective full rings, with some of the full rings not illustrated. VGAA transistor 52 includes gate dielectric 36 and gate electrode 38 encircling nanowire 22, and spacers 34 as horizontal layers.

VGAA transistor 52 includes source/drain regions 42 and channel region 54 between and interconnecting source/drain regions 42. Channel region 54 is a part of nanowire 22. Each of source/drain regions 42 and channel region 54 (and wurtzite semiconductor nanowire 22) may be formed as a nanowire having a lengthwise direction perpendicular to the major top and bottom surfaces of the underlying substrate 20. The nanowires may have lateral dimensions (length, width, or diameter, depending on their top-view shapes) of several hundred nanometers or smaller. For example, the lateral dimensions of the nanowires may be in the range between about 10 nm and about 100 nm.

The channel region 54 and source/drain regions 42 may be formed of the same materials as the respective regions in FinFETs and planar transistors as shown in FIGS. 3 through 12. As shown in FIG. 13, lengthwise direction DL is in the source-drain direction, and is perpendicular to the major top surface or bottom surface of substrate 20. In the embodiments wherein wurtzite semiconductor nanowire 22 (in which channel 54 is located) is formed of direct-band wurtzite silicon or direct-band wurtzite germanium, source-drain direction DL may be parallel to the [01-10] direction of wurtzite semiconductor nanowire 22. In alternative embodiments in which wurtzite semiconductor nanowire 22 is formed of indirect-band wurtzite silicon, the respective source-drain direction DL is parallel to the [−2110] direction of wurtzite semiconductor nanowire 22. Also, as shown in FIG. 13, the [01-10] direction or the [−2110] direction may point up or down.

FIG. 14 illustrates a top view or a bottom view of wurtzite semiconductor nanowire 22, which is surrounded by gate dielectric 36 and gate electrode 38. Although FIG. 14 illustrates that wurtzite semiconductor nanowire 22 has a rounded top-view shape, other shapes such as rectangles, hexagons, ellipses, or the like, may also be used.

FIG. 15 illustrates a top view or a bottom view of a portion of VGAA transistor 52 (FIG. 13) in accordance with yet alternative embodiments. These embodiments are similar to the embodiments in FIG. 14, except that wurtzite semiconductor 22 is formed as a nanotube encircling nanowire 20'. Nanowire 20' may be formed of a material selected from the same group of candidate materials as substrate 20 (FIG. 9A), and may include GaN, GaP, silicon oxide, or the like. Again, in the embodiments wherein wurtzite semiconductor nano-tube 22 (in which channel 54 is located) is formed of direct-band wurtzite silicon or direct-band wurtzite germanium, source-drain direction DL may be parallel to the [01-10] direction of wurtzite semiconductor nano-tube 22. In alternative embodiments in which wurtzite semiconductor nano-tube 22 is formed of indirect-band wurtzite silicon, the respective source-drain direction DL is parallel to the [−2110] direction of wurtzite semiconductor nano-tube 22. Also, as shown in FIG. 13, the [01-10] direction or the [−2110] direction may point up or down may be point up or point down.

Figure 16:
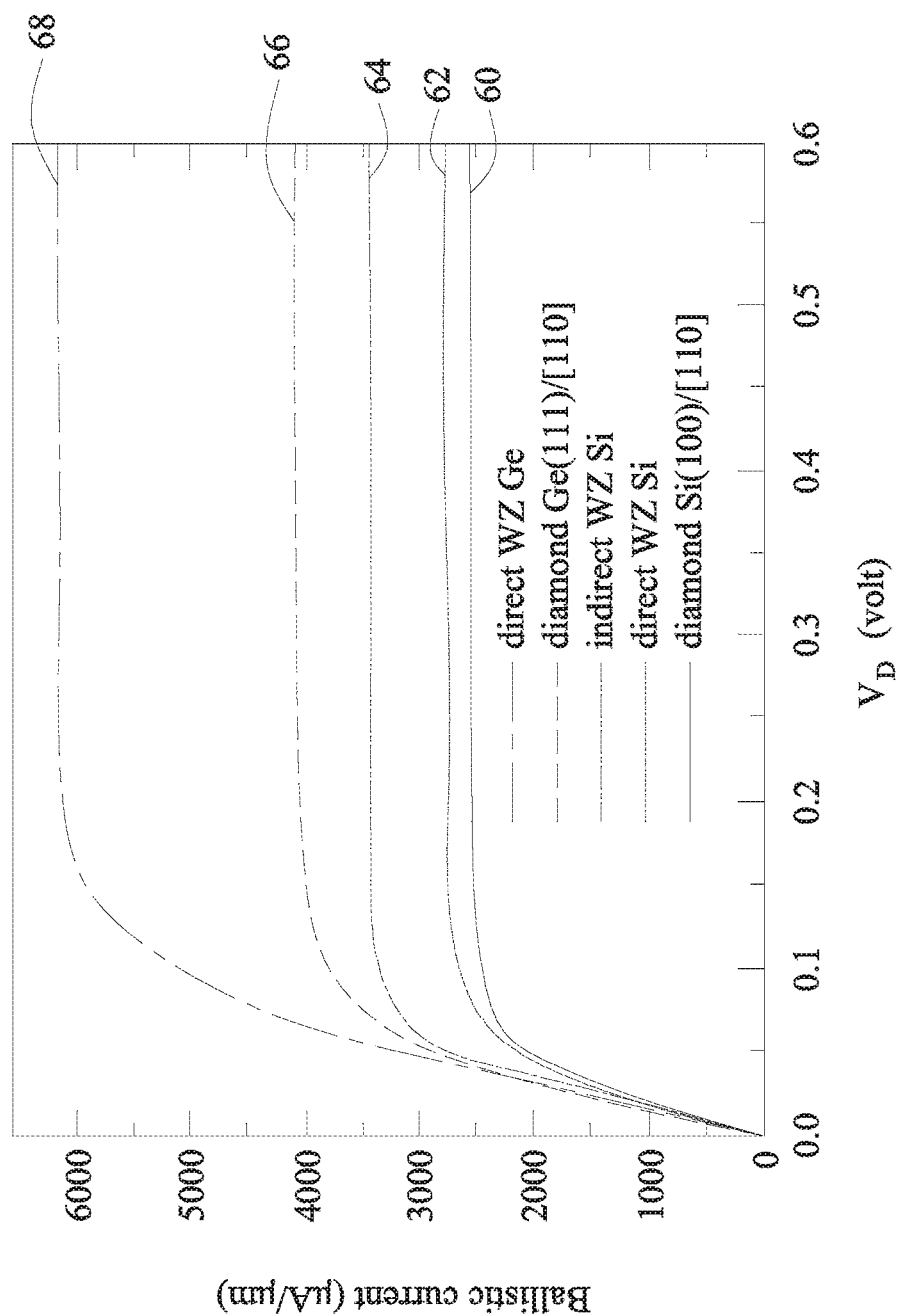
FIG. 16 illustrates ballistic currents of various semiconductor materials as functions of drain voltages in various exemplary transistors.

The embodiments of the present disclosure have some advantageous features. FIG. 16 illustrates the ballistic currents of exemplary transistors as functions of drain voltages. The channel regions of the exemplary transistors are formed of different materials, wherein lines 60, 62, 64, 66, and 68 are obtained from the transistors whose channels are formed of diamond silicon, direct-band wurtzite silicon, indirect wurtzite silicon, diamond germanium, and direct-band wurtzite germanium, respectively. The source-drain directions of the transistors formed of the direct-band wurtzite silicon (line 62) and direct-band wurtzite germanium (line 68) are parallel to the respective [01-10] direction, and the source-drain direction of the transistor formed of the indirect-band wurtzite silicon (line 64) is parallel to the respective [−2110] direction. The DW directions of the transistors corresponding to lines 62 and 68 are parallel to the respective [0001] direction, and the DW direction of the transistor corresponding to line 64 is parallel to the respective [01-10] direction. FIG. 15 illustrates that the ballistic currents represented by lines 62 and 64 are higher than the ballistic current represented by line 60. Also, the ballistic currents represented by line 68 are higher than the ballistic currents represented by line 66. These results reveal that the transistors having wurtzite semiconductor channels with the discussed source-drain directions have increased currents over the transistors having diamond semiconductor channels. Hence, the drive currents of the transistors in accordance with the embodiments of the present disclosure are increased.

In accordance with some embodiments of the present disclosure, a device includes a source region, a drain region, and a wurtzite semiconductor between the source region and the drain region. A source-drain direction is parallel to a [01-10] direction or a [−2110] direction of the wurtzite semiconductor. The device further includes a gate dielectric over the wurtzite semiconductor, and a gate electrode over the gate dielectric.

In accordance with alternative embodiments of the present disclosure, a device includes a substrate, a channel region over the substrate, with the channel region formed of a wurtzite semiconductor including silicon or germanium, a source region, and a drain region. A source-drain direction interconnecting the source region and the drain region is parallel to a [01-10] direction or a [−2110] direction of the wurtzite semiconductor. The device further includes a gate dielectric including a portion overlapping the channel region, and a gate electrode over the gate dielectric.

In accordance with yet alternative embodiments of the present disclosure, a device includes a substrate, dielectric regions over the substrate, and a wurtzite semiconductor strip over the substrate and between opposite portions of the dielectric regions. A top portion of the wurtzite semiconductor strip protrudes over top surfaces of the dielectric regions to form a wurtzite semiconductor fin, and a lengthwise direction of the wurtzite semiconductor strip is parallel to a [01-10] direction or a [−2110] direction of the wurtzite semiconductor strip. A gate dielectric is over a top surface and on sidewalls of the wurtzite semiconductor fin. A gate electrode is over the gate dielectric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   growing a wurtzite semiconductor layer from a substrate, wherein the substrate has a hexagonal structure;
   patterning the wurtzite semiconductor layer to form a wurtzite semiconductor region;
   forming a gate dielectric over a middle portion of the wurtzite semiconductor region;
   forming a gate electrode over the gate dielectric; and
   forming a source/drain region on a side of the gate electrode.

2. The method of claim 1, wherein the growing the wurtzite semiconductor layer from the substrate comprises growing the wurtzite semiconductor layer starting from a dielectric hexagonal structure.

3. The method of claim 1, wherein the growing the wurtzite semiconductor layer from the substrate comprises growing the wurtzite semiconductor layer starting from a semiconductor hexagonal structure.

4. The method of claim 1, wherein the patterning the wurtzite semiconductor layer is stopped when the substrate is exposed.

5. The method of claim 1, wherein the patterning the wurtzite semiconductor layer is stopped when a recess formed in the wurtzite semiconductor layer has a bottom at an intermediate level between a top surface and a bottom surface of the wurtzite semiconductor layer.

6. The method of claim 1, wherein the wurtzite semiconductor layer comprises a direct-band wurtzite material, and the wurtzite semiconductor region is etched to be elongated with a lengthwise direction parallel to a [01-10] direction of the wurtzite semiconductor layer.

7. The method of claim 1, wherein the wurtzite semiconductor layer comprises an indirect-band wurtzite material, and the wurtzite semiconductor region is etched to be elongated with a lengthwise direction parallel to a [−2110] direction of the wurtzite semiconductor layer.

8. The method of claim 1 further comprising;
after the wurtzite semiconductor layer is patterned, filling a dielectric material into a recess formed by the patterning; and
performing a planarization on the dielectric material and the wurtzite semiconductor region.

9. The method of claim 8 further comprising recessing the dielectric material, wherein a portion of the wurtzite semiconductor region is higher than a top surface of a remaining portion of the dielectric material to form a semiconductor fin.

10. A method comprising:
growing a wurtzite semiconductor layer from a silicon oxide layer;
etching the wurtzite semiconductor layer to form a wurtzite semiconductor strip, with a recess formed to extend into the wurtzite semiconductor layer;
forming a dielectric region in the recess;
planarizing the dielectric region and the wurtzite semiconductor strip;
forming a gate dielectric over a portion of the wurtzite semiconductor strip;
forming a gate electrode over the gate dielectric; and
forming a source/drain region on a side of the gate electrode.

11. The method of claim 10, wherein the silicon oxide layer has a hexagonal structure.

12. The method of claim 10, wherein the wurtzite semiconductor layer is grown at a temperature between about 400° C. and about 700° C.

13. The method of claim 10, wherein when the etching the wurtzite semiconductor layer is finished, a remaining portion of the wurtzite semiconductor layer is directly underlying the recess.

14. The method of claim 10, wherein when the etching the wurtzite semiconductor layer is finished, a top surface of the silicon oxide layer is exposed to the recess.

15. The method of claim 10, wherein the wurtzite semiconductor layer comprises a direct-band wurtzite material, and the wurtzite semiconductor strip is etched to be elongated with a lengthwise direction parallel to a [01-10] direction of the wurtzite semiconductor layer.

16. The method of claim 10, wherein the wurtzite semiconductor layer comprises an indirect-band wurtzite material, and the wurtzite semiconductor strip is etched to be elongated with a lengthwise direction parallel to a [-2110] direction of the wurtzite semiconductor layer.

17. A method comprising:
growing a wurtzite semiconductor layer from a semiconductor layer;
etching the wurtzite semiconductor layer to form a wurtzite semiconductor strip, with a recess formed to extend into the wurtzite semiconductor layer;
forming a dielectric region in the recess;
planarizing the dielectric region and the wurtzite semiconductor strip;
forming a gate dielectric over a portion of the wurtzite semiconductor strip;
forming a gate electrode over the gate dielectric; and
forming a source/drain region on a side of the gate electrode.

18. The method of claim 17, wherein the semiconductor layer comprises gallium nitride or gallium phosphide.

19. The method of claim 17, wherein the wurtzite semiconductor layer is grown at a temperature between about 400° C. and about 700° C.

20. The method of claim 17 further comprising recessing the dielectric region, wherein a portion of the wurtzite semiconductor strip is higher than a top surface of a remaining portion of the dielectric region to form a semiconductor fin, and the gate dielectric is formed on a sidewall and a top surface of the semiconductor fin.

* * * * *